United States Patent [19]
Souetinov

[11] Patent Number: 5,945,880
[45] Date of Patent: Aug. 31, 1999

[54] LOW NOISE AMPLIFIER

[75] Inventor: Viatcheslav Souetinov, Swindon, United Kingdom

[73] Assignee: Mitel Semiconductor Limited, United Kingdom

[21] Appl. No.: 09/003,909

[22] Filed: Jan. 7, 1998

[30] Foreign Application Priority Data

Jan. 11, 1997 [GB] United Kingdom .................... 9700487

[51] Int. Cl.[6] ................................ H03F 3/04; H03F 3/00
[52] U.S. Cl. ............................................. 330/311; 330/148
[58] Field of Search ..................................... 330/275, 301, 330/148, 288, 311

[56] References Cited

U.S. PATENT DOCUMENTS

| | | |
|---|---|---|
| 3,972,003 | 7/1976 | Schroeder . |
| 4,049,977 | 9/1977 | Radovsky ................................. 330/288 |
| 4,159,489 | 6/1979 | Braitberg . |
| 4,485,351 | 11/1984 | Schemmel et al. ..................... 330/288 |
| 4,956,615 | 9/1990 | Bohme et al. .......................... 330/301 |

FOREIGN PATENT DOCUMENTS

| | | |
|---|---|---|
| 0 149 749 A1 | 7/1985 | European Pat. Off. . |
| 0 351 639 A2 | 1/1990 | European Pat. Off. . |
| 0 499 263 A1 | 8/1992 | European Pat. Off. . |

*Primary Examiner*—Robert Pascal
*Assistant Examiner*—Patricia Nguyen
*Attorney, Agent, or Firm*—Kirschstein, et al.

[57] ABSTRACT

An amplifier, suitable for radio frequency applications, has good noise properties because of a special transistor configuration. A pair of transistors is connected in a cascode configuration, to overcome the Miller effect. The transistors have their bases driven by a common current source. The main current paths from ground to each of the output terminals are essentially noise-free. One of the transistors, acting as a transconductance amplifier, does introduce some noise though this is minimized by the use of an inductor. A third transistor forms a current source for the current path to one of the output terminals. A differential output is achieved at the output terminals because the pair of transistors has complementary outputs. In another embodiment, a capacitor is connected across the collector and base electrodes of one of the transistors to introduce a further stage of gain.

15 Claims, 2 Drawing Sheets

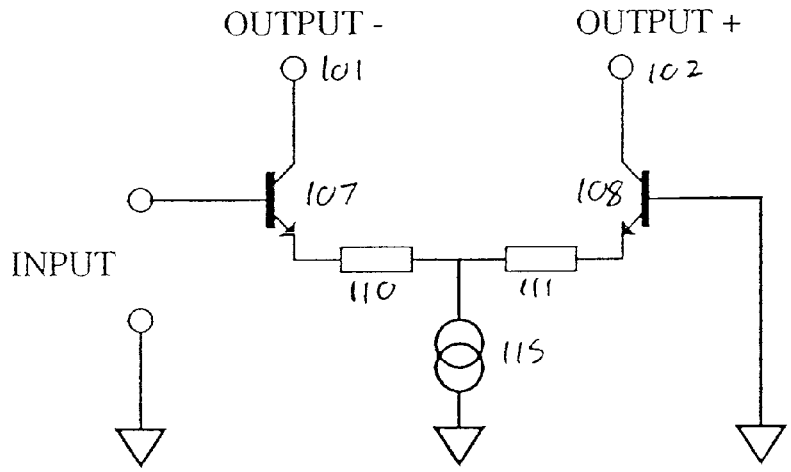
FIGURE 1 - PRIOR ART
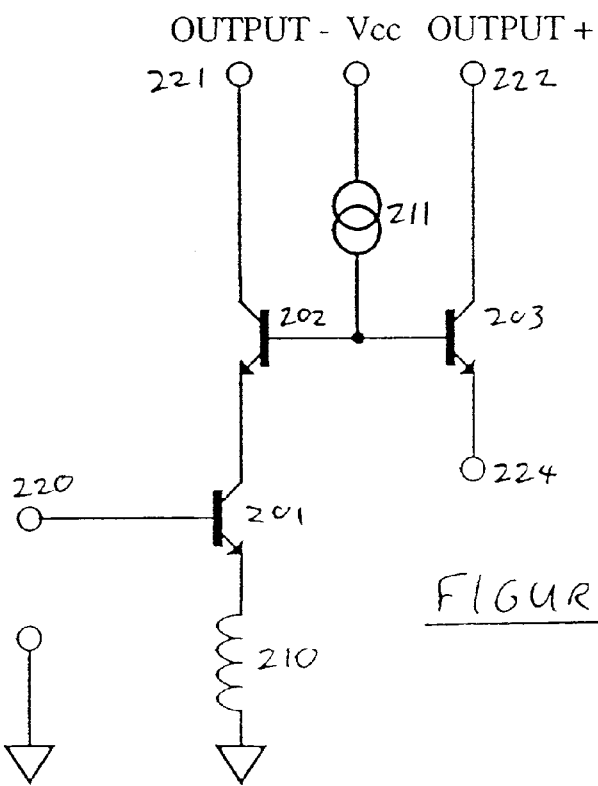
FIGURE 2

5,945,880

LOW NOISE AMPLIFIER

BACKGROUND OF THE INVENTION

The present invention relates to amplifier circuits and in particular to amplifier circuits that convert a single-ended input signal into a differential output signal.

Signal processing circuitry, especially for radio receivers and the like, usually requires a differential input signal. It is common in many electronics applications to require the conversion of a single-ended signal into differential form so that it can be properly handled by whatever signal processing circuitry is used. This conversion is typically carried out using circuits such as that shown in FIG. 1.

FIG. 1 shows a single-ended input, differential output amplifier formed from an emitter coupled transistor pair. Current source 115 draws current from the emitter electrodes at npn transistors 107 or 108 by way of resistors 110 and 111 respectively.

As is well known, an increase in the signal input to the base electrode of transistor 107 will effect an increase in the current flowing from the collector electrode of transistor 107 and a decrease in the current flowing from the collector electrode of transistor 108. The opposite effect occurs when there is a decrease in the input signal. The collector currents of transistors 107, 108 form a differential output signal at output terminals 101, 102. The output signal will be balanced if current source 115 is implemented as a constant current source.

Although the amplifier of FIG. 1 offers reasonable linearity and a balanced output, the circuit has poor noise properties. These noise properties are due largely to the thermal noise of resistors 110, 111, which create noise directly in the main current paths. Current source 115 will also introduce noise into the output signal because it experiences quite large voltage swings at its connection with resistors 110 and 111. A significant amount of noise will appear at output terminals 101, 102 as a result of transistors 107, 108 having their base resistances in series.

Because the single-ended to differential signal converting amplifier stage is usually used to prepare raw input signals for signal processing, reductions in noise figure made in this amplifier circuit have a greater effect than noise figure reductions made elsewhere. There exists a need for a single-ended input, differential output amplifier circuit with improved noise properties.

SUMMARY OF THE INVENTION

In accordance with the present invention, there is provided an amplifier circuit arrangement comprising first and second transistors having their control electrodes connected together and to a current source in which, in use, a driving current signal at the second main electrode of the first transistor, representative of an input voltage signal, causes substantially complementary current signals to be output from the respective first main electrodes of the first and second transistors.

BRIEF DESCRIPTION OF THE DRAWINGS

Embodiments of the present invention will now be described, by way of example only, with reference to the accompanying drawings, of which:

FIG. 1 shows a prior art amplifier circuit,

FIG. 2 shows an amplifier circuit embodying the principle of the present invention;

DETAILED DESCRIPTION OF THE PREFERRED EMBODIMENTS

Figure 3:
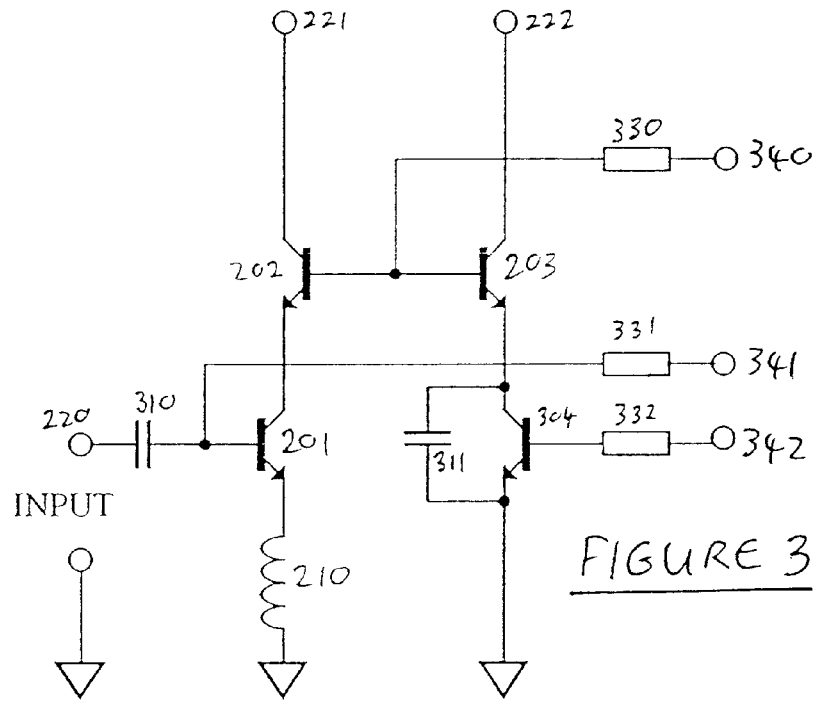
FIG. 3 shows an improved amplifier circuit in accordance with the present invention.

Referring to the drawings, FIG. 2 shows a single-ended input, differential output amplifier circuit in accordance with the present invention having npn bipolar transistors 201–203, current source 211 and inductor 210. Transistors 201 and 202 are connected in a cascode configuration whilst transistor 202 is also base-coupled with transistor 203. Degeneration inductor 210 is connected between the emitter electrode of transistor 201 and ground potential. Due to the complex nature of the common current gain β of transistor 201 at radio frequencies, inductor 210 effects series negative feedback in the base-emitter circuit of transistor 201.

A voltage signal is applied as the input signal to terminal 220 which is connected to the base electrode of transistor 201. Transistor 201 functions as a transconductance amplifier, translating an input voltage to an output current which is fed to the emitter electrode of transistor 202.

Transistors 202 and 203 have complementary collector currents, variations in the collector current of transistor 201 causing variations in the distribution of the current from current source 211 between the base electrodes and hence the collector electrodes of transistors 202 and 203. Current source 211 preferably has a substantially constant current output. Transistors 202 and 203 introduce a negligible level of noise into the output currents because they are driven by a current source, that of transistor 201. Simulation of the amplifier circuit of FIG. 2 has found that the noise figure of such an amplifier is no higher than that of a cascode circuit in isolation. The amplifier circuit was also found to have a well balanced output.

Cascode circuits per se are well known for their good noise properties. From FIG. 2 it can be seen that these noise properties occur because transistor 202 prevents the collector of transistor 201 from swinging and thereby substantially eliminates the Miller effect.

Inductor 210 is a noiseless component which provides frequency independent degeneration over a particular frequency range. This range is dependent on the value of inductor 210 and the base-emitter resistance of transistor 201 at the desired frequency. The value of inductor 210 also affects the gain of the amplifier circuit and its linearity. Although a resistor could be used in place of inductor 210, the amplifier circuit has much more linear characteristics and better noise properties when inductor 210 is used.

Inductor 210 can be implemented, in whole or in part, with the parasitic inductance of IC packaging, bonding wires and/or connecting pins.

Transistors that are used in low noise applications are generally fabricated with large emitter areas. These transistors have a lower base-emitter resistance than smaller area transistors and hence produce less noise.

Transistors 201, 202 and 203 are preferably implemented as large emitter area transistors and more preferably with transistor 201 having a larger area than transistors 202 and 203. The sizing of transistor 201 is particularly important because it determines a number of properties of the amplifier circuit. A larger area transistor will have better noise properties because the input impedance of the transistor will be lower. However, a larger area transistor will also have higher parasitic capacitances, and hence leakage, and a lower current gain β caused by a lower current density.

The level of current flowing in transistor 201 also affects its behaviour and therefore the properties of the amplifier circuit. Operating transistor 201 with a low bias current will give it good noise properties but will also cause β to be lower than it would be for a higher bias current. Transistor 201, and the operating current thereof, is therefore a trade-off between noise figure and gain. Power efficiency requirements may also affect the operating current incorporated in the amplifier circuit design.

At high frequencies, the behaviour of transistors 202 and 203 will change because of their parasitic capacitances, present across both the base-emitter and base-collector junctions of transistors 202, 203. Leakage will occur between the emitter and the base electrodes of transistor 202 causing unbalancing between transistors 202 and 203.

This can be compensated for by forming transistor 202 with a larger emitter area than that of transistor 203. This large area transistor 202 will have a lower current density and hence a lower β. This will cause extra current to flow in the base of transistor 202 to compensate for current lost in the parasitic capacitances.

The emitter areas used for the transistors 202 and 203 will depend on the frequency at which the amplifier circuit is to be operated, because β is frequency dependent, and on the bias current driving transistors 202 and 203.

FIG. 3 shows an improved amplifier circuit in accordance with the present invention. Components the same as those shown in FIG. 2 have retained the same reference numerals.

Current source 211 of FIG. 2 has been implemented in the FIG. 3 circuit with resistor 330 and a reference potential at terminal 340. Resistor 330 will preferably be of a high value so as to pass a small but substantially constant current to transistors 202, 203. Independent biasing of transistors 201 and 304 is provided by reference potential terminal and resistor 341, 331 and 342, 332 respectively. The independent biasing of transistors 201 and 304 allows control over the balancing of the signals at output terminals 221 and 222. Capacitor 311 is shown connected across transistor 304 simply for ease, its presence provides ac grounding for the emitter terminal of transistor 203. Capacitor 310, however, is a blocking capacitor to prevent the bias of transistor 201 being affected by dc input signals.

Figure 4:
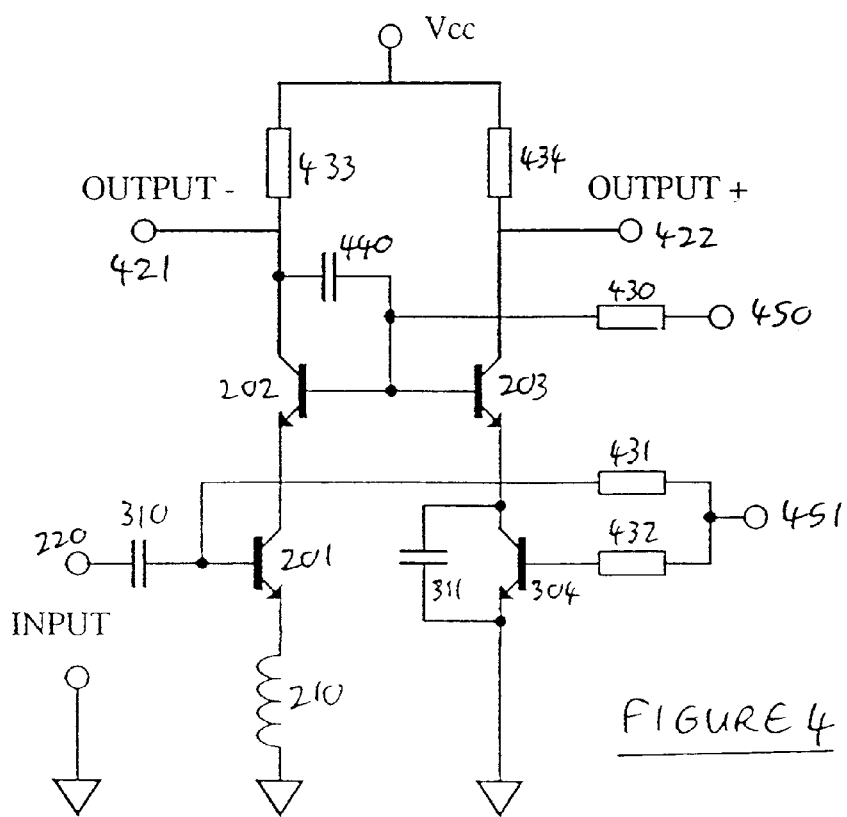
FIG. 4 shows a further amplifier circuit in accordance with the present invention.

FIG. 4 shows a further embodiment of an amplifier circuit in accordance with the present invention. Components the same as those shown in FIG. 3 have retained the same reference numerals.

An extra stage of amplification is provided by capacitor 440, connected across the collector and base electrodes of transistor 202. Output terminals 421, 422 show a voltage output, rather than a current output, by virtue of resistors 433, 434. The ac voltage at output terminal 421 is fed back to the commoned bases of transistors 202 and 203. The gain induced by capacitor 440 will appear at non-inverting output terminal 422 because the open pn junction of transistor 203 presents a low impedance to the ac current created by capacitor 440 whereas the current source formed by the amplifier circuit input stage, comprising transistor 201, inductor 210, capacitor 310 and input terminal 220, presents a high impedance.

Thus, the signal at output terminal 422 will be larger than the signal at terminal 421 and the amplifier circuit will have presented an unbalanced output at its output terminals 421, 422. However, this is of little importance when the output terminals present a signal to differential inputs of a next stage.

To improve the noise figure further, resistors 433, 434 could be replaced with degeneration inductors.

FIG. 4 also demonstrates the biasing of transistors 201, 304 by the use of separate resistors 431, 432 and a single reference potential, applied to terminal 451.

Although the embodiments have been described solely with regard to npn bipolar resistors, the invention is not restricted to such and could equally be effected with pnp bipolar transistors or with field effect transistors. The collector and emitter electrodes referred to will be interchangeable with emitter and collector, source and drain or drain and source electrodes as the first and second main electrodes of a pnp or a field effect transistor.

I claim:

1. An amplifier circuit arrangement, comprising: a first transistor having a control electrode, a first main electrode, and a second main electrode; a second transistor having a control electrode, a first main electrode, and a second main electrode; the control electrodes being connected together and to a current source; the second main electrode of the second transistor being ac grounded; and the second main electrode of the first transistor receiving a driving current signal representative of an input voltage signal, for causing substantially complementary current signals to be output from the respective first main electrodes of the first and second transistors.

2. The amplifier circuit arrangement in accordance with claim 1, in which the second main electrode of the second transistor is ac grounded by a capacitor.

3. The amplifier circuit arrangement in accordance with claim 1, in which a third transistor has a control electrode, a first main electrode, and a second main electrode, and in which the control electrode of the third transistor receives the input voltage signal, and in which the first main electrode of the third transistor is electrically connected to the second main electrode of the first transistor, thereby to provide the driving current signal from the input voltage signal.

4. The amplifier circuit arrangement in accordance with claim 3, in which the control electrode of the third transistor is biased by a first reference potential and a resistor, and receives the input voltage signal at the control electrode of the third transistor via a first capacitor.

5. The amplifier circuit arrangement in accordance with claim 3, in which an inductor is connected between the second main electrode of the third transistor and ground potential.

6. The amplifier circuit arrangement in accordance with claim 5, in which the inductor is formed partly from at least one of bonding wires, connecting pins and integrated circuit packaging.

7. The amplifier circuit arrangement in accordance with claim 4, in which the first main electrodes of the first and second transistors are connected to a second reference potential by respective resistors, and in which the first transistor has a feedback capacitor connected across the control and first main electrodes of the first transistor, for increasing the gain of a signal output from the first main electrode of the second transistor.

8. An amplifier circuit arrangement, comprising: a first transistor having a control electrode, a first main electrode, and a second main electrode; a second transistor having a control electrode, a first main electrode, and a second main electrode; the control electrodes being connected together and to a current source; a biasing transistor having a control electrode connected to a current source, a first main electrode electrically connected to the first main electrode of the second transistor, and a second main electrode connected to ground potential, for biasing the second transistor; the second main electrode of the first transistor receiving a driving current signal representative of an input voltage signal, for causing substantially complementary current signals to be output from the respective first main electrodes of the first and second transistors.

9. The amplifier circuit arrangement in accordance with claim 8, in which the second main electrode of the second transistor is ac grounded.

10. The amplifier circuit arrangement in accordance with claim 9, in which the second main electrode of the second transistor is ac grounded by a capacitor.

11. The amplifier circuit arrangement in accordance with claim 8, in which a third transistor has a control electrode, a first main electrode, and a second main electrode, and in which the control electrode of the third transistor receives the input voltage signal, and in which the first main electrode of the third transistor is electrically connected to the second main electrode of the first transistor, thereby to provide the driving current signal from the input voltage signal.

12. The amplifier circuit arrangement in accordance with claim 11, in which the control electrode of the third transistor is biased by a first reference potential and a resistor, and receives the input voltage signal at the control electrode of the third transistor via a first capacitor.

13. The amplifier circuit arrangement in accordance with claim 11, in which an inductor is connected between the second main electrode of the third transistor and ground potential.

14. The amplifier circuit arrangement in accordance with claim 13, in which the inductor is formed partly from at least one of bonding wires, connecting pins and integrated circuit packaging.

15. The amplifier circuit arrangement in accordance with claim 12, in which the first main electrodes of the first and second transistors are connected to a second reference potential by respective resistors; and in which the first transistor has a feedback capacitor connected across the control and first main electrodes of the first transistor, for increasing the gain of a signal output from the first main electrode of the second transistor.

* * * * *